(12) United States Patent
Hsu

(10) Patent No.: US 7,161,380 B2
(45) Date of Patent: *Jan. 9, 2007

(54) APPARATUS AND METHOD ADAPTED TO USE ONE-TIME PROGRAMMING DEVICES FOR MULTIPLE-TIME PROGRAMMING

(75) Inventor: Shih-Pin Hsu, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/908,406

(22) Filed: May 11, 2005

(65) Prior Publication Data

US 2005/0253624 A1   Nov. 17, 2005

(30) Foreign Application Priority Data

May 14, 2004   (TW)   ................................ 93113594 A

(51) Int. Cl.
*H03K 19/173*   (2006.01)
(52) U.S. Cl. .......................................... 326/38; 326/47
(58) Field of Classification Search ................. 326/37, 326/38, 39, 41
See application file for complete search history.

(56) References Cited

U.S. PATENT DOCUMENTS

| | | | | |
|---|---|---|---|---|
| 5,023,838 A | * | 6/1991 | Herbert | ................. 365/189.08 |
| 6,121,791 A | * | 9/2000 | Abbott | ........................ 326/39 |
| 6,690,193 B1 | * | 2/2004 | Heinzer et al. | ................ 326/37 |
| 2005/0232039 A1 | * | 10/2005 | Hsu | ........................... 365/201 |

* cited by examiner

*Primary Examiner*—James H. Cho
(74) *Attorney, Agent, or Firm*—Jianq Chyun IP Office

(57) ABSTRACT

An apparatus and method adapted to use one-time programming (OTP) devices for multiple-time programming is disclosed. The apparatus includes a selecting device, a first adjusting OTP device, a second adjusting OTP device and a judging device. The judging device outputs a selecting signal according to whether the second adjusting OTP element is programmed. According to the selecting signal, the selecting device selects and outputs either the first OTP signal outputted from the first adjusting OTP device or the second OTP signal outputted from the second adjusting OTP device. By using this apparatus and method, the present invention serves multiple-time programming function without the high costs of manufacturing multiple-time programming devices.

34 Claims, 2 Drawing Sheets

APPARATUS AND METHOD ADAPTED TO USE ONE-TIME PROGRAMMING DEVICES FOR MULTIPLE-TIME PROGRAMMING

CROSS-REFERENCE TO RELATED APPLICATION

This application claims the priority benefit of Taiwan application serial no. 93113594, filed on May 14, 2004. All disclosure of the Taiwan application is incorporated herein by reference.

BACKGROUND OF THE INVENTION

1. Field of the Invention

The present invention relates to an integrated circuit, and more particularly to an apparatus and a method adapted to use one-time programming (OTP) devices for multiple-time programming (MTP).

2. Description of the Related Art

In a proceeding of an integrated circuit manufacture, the electrical parameters of each integrated circuit may vary from lot to lot, and vary from wafer to wafer of the same lot, and even vary from die to die of the same wafer. There are different process variations such as deviation of ion implantation, deviation of gate oxide thickness, and error in etching. Such variation of process will cause frequency deviation of an oscillator, or voltage deviation of a regulator. If the electrical parameters of an integrated circuit vary beyond the specification, e.g. over 5% deviation of the IC specification, the product is deemed failed during testing process. Accordingly, the IC manufacturer should perform some post-fabrication fine-tuning of the parameters of integrated circuits mentioned above to improve production yield. Since the electrical characteristics mentioned above change along with fabricating parameters, one-time programming (OTP) devices, e.g. poly fuse and metal wire, are used for post-fabrication fine-tuning for electrical characteristics consistency within a lot, thus improve the production yield. The OTP method can effectively improve production yield of integrated circuits.

The OTP method applied to integrated circuits includes: laser trimming or poly fusing (E-fuse). The laser-trimming method is to blow a metal wire with high-energy laser. The poly-fusing method is to blow the poly fuse with a large current or to change the resistance of the poly fuse caused by electron migration phenomenon under large current. Then a reading circuit detects whether the metal wire or the poly wire is open or whether the resistance of the poly fuse is changed. By the detection, it can be determined whether the OTP device is programmed or not. The programming step is an irreversible, destructive operation. It means that the OTP device can be programmed only once and cannot be repaired.

After the OTP device is programmed, the poly fuse of the OTP device is blown and cannot be repaired. The OTP device, therefore, cannot be multiple-time programmed. It is desired that the electrical characters of integrated circuits can be repetitively changed. For the example of STN LCD drivers, the operating voltage VLCD of the STN LCD drivers has been adjusted to a precise value during the testing process. During STN LCD module assembling process, the operating voltage VLCD of the STN LCD drivers may shift due to the characteristic shift of liquid crystal or the gap deviation of electrode on glass. The shift of operating voltage will ruin the contrast ratio of STN LCD. Accordingly, it is desired to fine tune the operating voltage VLCD of the STN LCD drivers for the purpose of improving production yield of the STN LCD modules.

In order to perform multiple-time programming, the prior art technique adopts multiple-time programming (MTP) devices. The MTP devices can be, for example, EPROM, EEPROM or FLASH. Although the MTP devices can serve multiple-time programming functions, the manufacturing costs of the MTP devices are more expensive. For the 0.35 μm 3.3V/18V high voltage process of STN LCD driver, to integrate the MTP device like EEPROM requires several additional masks. The additional masks increase the manufacturing costs. In addition to the higher costs, the manufacturing time and lead-time must be extended. By the increase of additional mask process, the yield of integrated circuits may decline. Few foundry companies are capable of fabricating such MTP devices and few MTP processes can be selected. Therefore, it is hard to find out an appropriate foundry company to fabricate MTP devices and the situation may risk productivity dispersion.

SUMMARY OF THE INVENTION

Accordingly, the present invention is directed to an apparatus adapted to use one-time programming (OTP) devices for multiple-time programming. By using different adjusting OTP devices, several different parameters are written into the OTP devices. The one-time programming restriction to the OTP devices is released and the apparatus can perform multiple-time programming.

The present invention is also directed to a method adapted to use one-time programming (OTP) devices for multiple-time programming. By determining whether the OTP devices are programmed, OTP signals are selected and outputted. The multiple-time programming can be performed by programming a plurality of OTP devices.

The present invention discloses an apparatus adapted to use one-time programming (OTP) devices for multiple-time programming. The apparatus comprises: a first adjusting OTP device, a second adjusting OTP device, a judging device and a selecting device. The first adjusting OTP device is adapted to output a first OTP signal. The second adjusting OTP device is adapted to output a second OTP signal. The judging device is coupled to the second adjusting OTP device and adapted to output a selecting signal. The selecting device is coupled to the first adjusting OTP device, the second adjusting OTP device and the judging device, adapted to select and output either the first OTP signal or the second OTP signal according to the selecting signal.

When a writing device writes the second adjusting data in the second adjusting OTP device, the selecting device selects and outputs the second OTP signal between the first OTP signal and the second OTP signal according to the selecting signal outputted from the judging device. Otherwise, the selecting device selects and outputs the first OTP signal.

The present invention discloses another apparatus adapted to use one-time programming (OTP) devices for multiple-time programming. The apparatus comprises: N+1 adjusting OTP devices, N judging devices and N selecting devices. The N+1 adjusting OTP devices are named in the sequence from 1, 2, . . . to N+1. The N judging devices are named in the sequence from 1, 2, . . . to N. The N selecting devices are named in the sequence from 1, 2, . . . to N. Each of the adjusting OTP devices outputs an OTP signal. Each of the judging devices outputs a selecting signal. Each of the selecting devices outputs an adjusting signal.

An Nth selecting device is coupled to the N+1th adjusting OTP device, an N−1th selecting device and the Nth judging device, adapted to select and output either the OTP signal outputted from the N+1th adjusting OTP device or the adjusting signal outputted from the N−1th selecting device according to the selecting signal outputted from the Nth judging device.

When a writing device writes an adjusting data in the N+1th adjusting OTP device, the Nth selecting device selects and outputs the N+1th OTP signal according to the Nth selecting signal outputted from the Nth judging device. Otherwise, the Nth selecting device selects and outputs the N−1th adjusting signal.

A first selecting device is coupled to a first adjusting OTP device, the second adjusting OTP device and a first judging device. When a writing device writes an adjusting data in the second adjusting OTP device, the first selecting device selects and outputs the second OTP signal between the first OTP signal and the second OTP signal according to the first selecting signal outputted from the first judging device. Otherwise, the first selecting device selects and outputs the first adjusting signal.

The present invention also discloses a method adapted to use one-time programming (OTP) devices for multiple-time programming. The method provides N+1 adjusting OTP devices which are named in the sequence from 1, 2, ... to N+1, each of the adjusting OTP devices outputting an OTP signal. The method provides N judging devices which are named in the sequence from 1, 2, ... to N, each of the judging devices outputting a selecting signal. The method then outputs a first adjusting signal by selecting either an OTP signal outputted from a first adjusting OTP device or an OTP signal outputted from a second adjusting OTP device according to a selecting signal outputted from a first judging device. The method selects and outputs either an OTP signal outputted from an N+1th adjusting OTP device or an adjusting signal outputted from an N−1th selecting device according to a selecting signal outputted from an Nth judging device.

According to the method adapted to use OTP devices for multiple-time programming of the present invention, if none of the adjusting data are written in any adjusting OTP device, the Nth judging device outputs a selecting signal according to an initial value of the N+1th adjusting OTP device. An Nth selecting device selects and outputs an N−1th adjusting signal between the OTP signal outputted from the N+1 adjusting OTP device and the N−1th adjusting signal outputted according to the selecting signal. A first selecting device selects and outputs an OTP signal outputted from the first adjusting OTP device between OTP signals of the first and second adjusting OTP devices according to the selecting signal.

In an embodiment of the present invention, when it is the first time to adjust the integrated circuit, the method further comprises writing a first adjusting data in the first adjusting OTP device. And when it is second time to adjust the integrated circuit, the method writes a second adjusting data in the second adjusting OTP device, the first judging devices determining that the second adjusting OTP device select and output an OTP signal outputted from the second adjusting OTP device between the OTP signal outputted from the first adjusting OTP device and the OTP signal outputted from the second adjusting OTP device. When the integrated circuit is adjusted thereafter, the method comprises writing a N+1th adjusting data in the N+1th adjusting OTP device, the Nth judging devices determining that the N+1th adjusting OTP device select and output an OTP signal outputted from the N+1th adjusting OTP device between the OTP signal outputted from the N+1th adjusting OTP device and the N−1th adjusting signal.

One of ordinary skill in the art can understand that the apparatus of the present invention further comprises a writing device coupled to the adjusting OTP devices and adapted to write the adjusting data in the adjusting OTP devices. In these embodiments of the present invention, the OTP devices comprise metal wires or poly fuses. The metal wires can be adjusted by laser trimming and the poly fuses can be adjusted by current trimming. The present invention of course is not limited thereto.

The present invention adopts the apparatus and method to use OTP devices for multiple-time programming. The present invention therefore achieves multiple-time programming function by using low-cost OTP devices. Although using OTP devices, the present invention performs as does a multiple-time programming (MTP) device. The process for manufacturing OTP devices is simpler than that of MTP devices and compatible with the other semiconductor manufacturing process. There are more foundry companies that can provide such manufacturing process. The manufacturing of OTP devices, therefore, is not limited to some specified companies and the costs of such OTP devices are low.

In order to make the aforementioned and other objects, features and advantages of the present invention understandable, a preferred embodiment accompanied with figures is described in detail below.

DESCRIPTION OF SOME EMBODIMENTS

Figure 1:
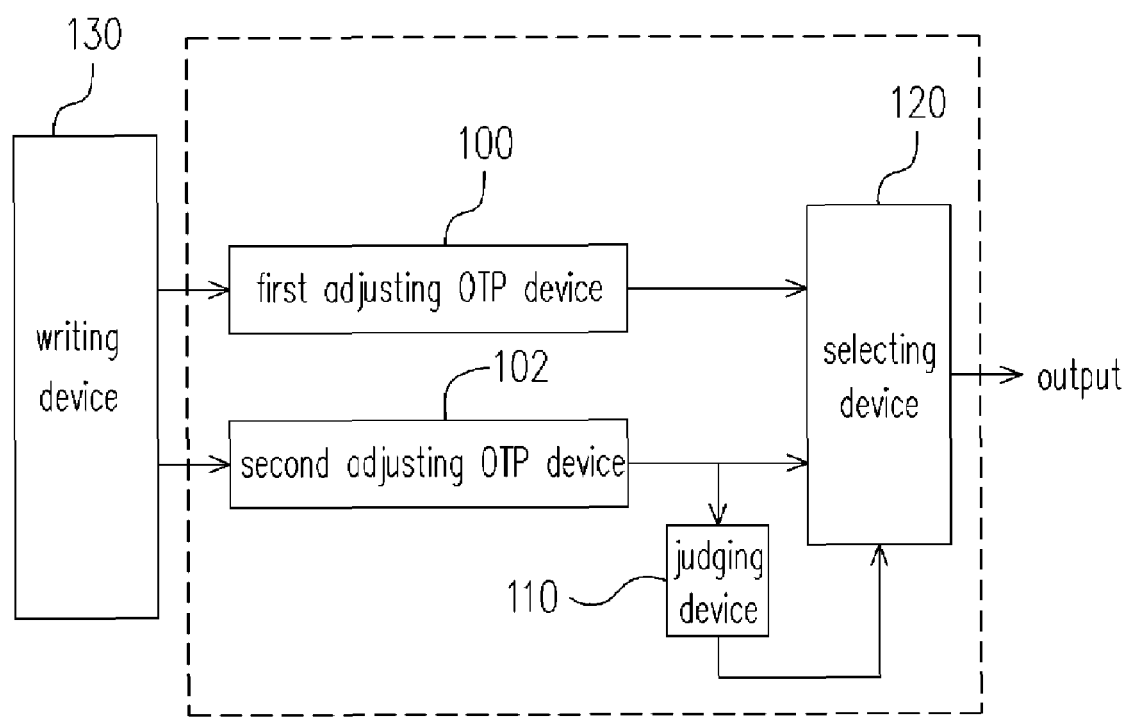
FIG. 1 is a schematic circuit block diagram of an apparatus adapted to use OTP devices for two-time programming according to an embodiment of the present invention.

FIG. 1 is a schematic circuit block diagram of an apparatus adapted to use OTP devices for two-time programming according to an embodiment of the present invention.

Referring to FIG. 1, the apparatus comprises a selecting device 120, a first adjusting OTP device 100, a second adjusting OTP device 102 and a judging device 110. The selecting device 120 is coupled to the first adjusting OTP device 100. The judging device 110 is coupled to the second adjusting OTP device 102. The apparatus further comprises a writing device 130 coupled to the first and the second adjusting OTP devices 100 and 102, respectively.

After the manufacturing of the integrated circuit of the apparatus according to the present invention is finished, the judging device 110 outputs a selecting signal according to an initial value of the second adjusting OTP device 102. Due to the selecting signal, the selecting device 120 selects a first OTP signal outputted from the first adjusting OTP device 100. The selecting device 120 then outputs an adjusting signal. When it is the first time to adjust the integrated circuit, the writing device 130 writes a first adjusting data in the first adjusting OTP device 100. The judging device 110 outputs the selecting signal to the selecting device 120 according to the initial value of the second adjusting OTP device 102. Due to the selecting signal, the selecting device 120, receiving the first OTP signal outputted from the first adjusting OTP device 100, outputs the adjusting signal.

When a second adjusting data are written into the second adjusting OTP device, the judging device 110 outputs another selecting signal according to the programmed second adjusting OTP device. Due to the selecting signal, the selecting device 120 selects the second adjusting OTP device 102. Through the second adjusting OTP device, the selecting device receives the second OTP signal and outputs the adjusting signal.

Figure 2:
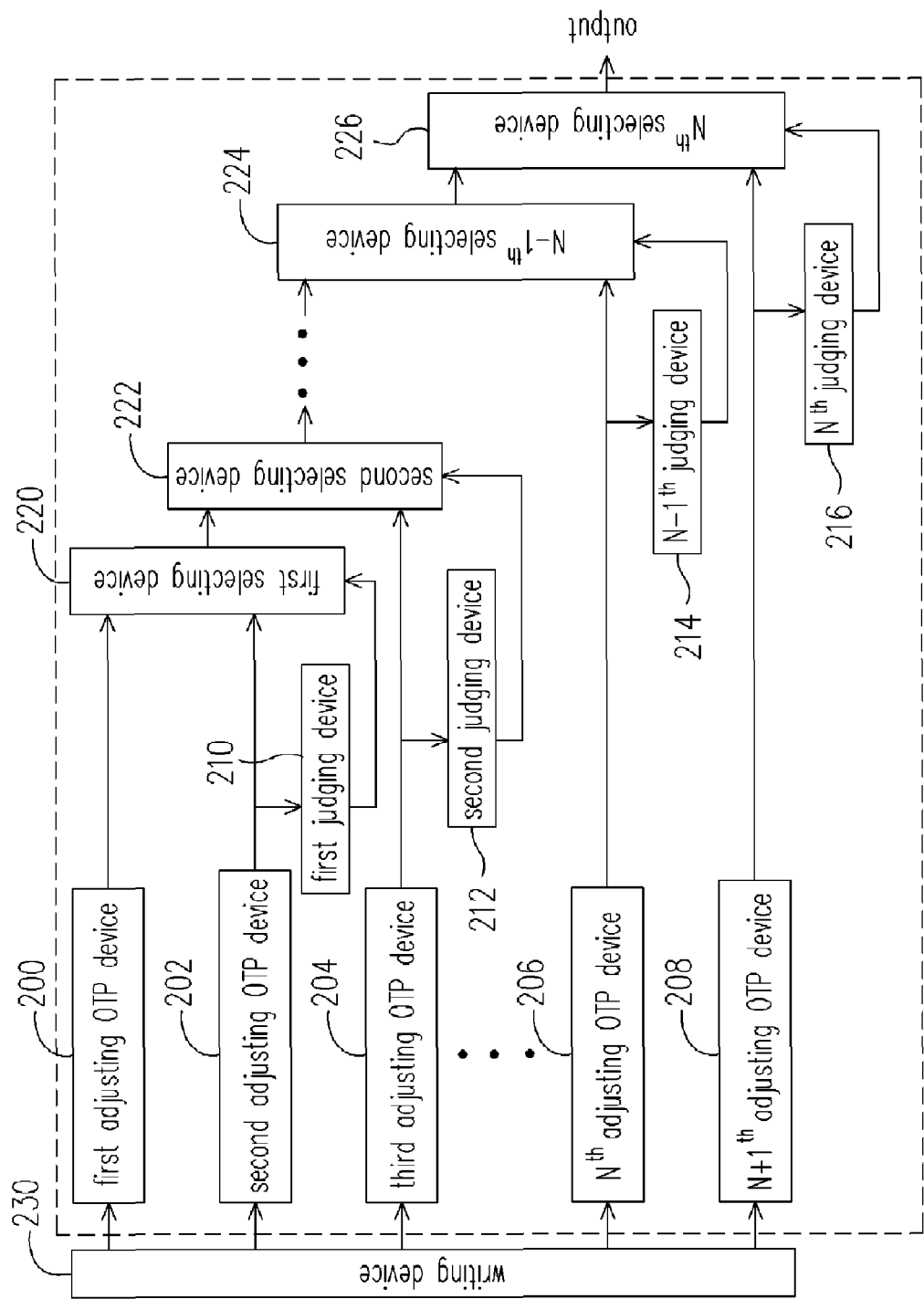
FIG. 2 is a schematic circuit block diagram of another apparatus adapted to use OTP devices for multiple-time programming according to an embodiment of the present invention.

FIG. 2 is a schematic circuit block diagram of another apparatus adapted to use OTP devices for multiple-time programming according to an embodiment of the present invention. In this embodiment, N+1 times of writing adjusting data in the adjusting OTP devices are executed, wherein N is an integer not less than 1.

In this embodiment, the apparatus comprises N+1 adjusting OTP devices 200~208, N judging devices 210~216, and N selecting devices 220~226. The adjusting devices are named in the sequence from 1, 2, . . . to N+1, wherein the first adjusting OTP device is 200, the second adjusting OTP device is 202, and the N+1th adjusting OTP device is 208. The judging devices are named in the sequence from 1, 2, . . . to N, wherein the first judging device is 210, the second judging device is 212, and the Nth judging device is 216. The selecting devices are named in the sequence from 1, 2, . . . to N, wherein the first selecting device is 220, the second selecting device is 222 and the Nth selecting device is 226.

The first selecting device 220 is coupled to the fist adjusting OTP device 200, the second adjusting OTP device 202 and the first judging device 210. The Nth selecting device 226 is coupled to the N+1th adjusting OTP device 208, the N−1th selecting device 224 and the Nth judging device 216. The first judging device 210 is coupled to the second adjusting OTP device 202. According to the selecting signal outputted from the first judging device 210, the first selecting device 220 selects and outputs either the OTP signal of the first adjusting OTP device 200 or the OTP signal of the second adjusting OTP device 202. The Nth judging device 216 is coupled to the N+1th adjusting OTP device 208. According to the selecting signal outputted from the Nth judging device 216, the Nth selecting device 226 selects and outputs either the OTP signal outputted from the N+1th OTP device 208 or the adjusting signal outputted from the N−1th selecting device 224.

When none of adjusting data is written in any adjusting OTP device, the judging device 216 outputs a selecting signal according to the initial value of the N+1th adjusting OTP device 208. Due to the selecting signal, the Nth selecting device 226 selects and outputs the N−1th adjusting signal between the OTP signal outputted from the N+1th adjusting OTP device 208 or the N−1th adjusting signal. The first selecting device 220, according to the selecting signal responding to the initial value of the second adjusting OTP device 202, selects and outputs the OTP signal of the first adjusting OTP device 200 between the OTP signals outputted by the first adjusting OTP device 200 or the second adjusting OTP device 202.

When it is the first time to adjust the integrated circuit, the writing device 230 writes a first adjusting data in the first adjusting OTP device 200. The first adjusting OTP device 200 is programmed. Because the judging devices 210~216 output selecting signals according to the initial values of the adjusting OTP devices 202~208, the first selecting device 220 outputs a first adjusting signal by selecting the OTP signal outputted from the first adjusting OTP device 200 between the OTP signals outputted from the first adjusting OTP device 200 or the second adjusting OTP device 202. The second selecting device 222 outputs a second adjusting signal by selecting the first adjusting signal between the first adjusting signal and the OTP signal outputted from the third adjusting OTP device 204. Accordingly, the Nth selecting device 226 outputs the Nth adjusting signal by selecting the N−1th adjusting signal between the N−1th adjusting signal and the OTP signal outputted from the N+1 adjusting OTP device 208. Finally, the last output of the apparatus is the first adjusting data written in the first adjusting OTP device 200.

When it is the second time to adjust the integrated circuit, the writing device 230 writes a second adjusting data in the second adjusting OTP device 202. The second adjusting OTP device 202 is programmed. The first judging device 210 outputs a first selecting signal. Due to the first selecting signal, the first selecting device 220 outputs a first adjusting signal by selecting the OTP signal outputted form the second adjusting OTP device 202 between the OTP signals outputted from the first adjusting OTP device 200 and the second adjusting OTP device 202. The second judging device 212 outputs a second selecting signal according to the initial value of the third adjusting OTP device 204. Due to the second selecting signal, the second selecting device 222 outputs a second adjusting signal by selecting the first adjusting signal between the first adjusting signal and the OTP signal outputted from the third adjusting OTP device 204. Accordingly, the Nth judging device 216 outputs the Nth selecting signal according to the initial value of the adjusting OTP device 208. Due to the Nth selecting signal, the Nth selecting device 226 outputs the Nth adjusting signal by selecting the N−1th adjusting signal between the N−1th adjusting signal and the OTP signal outputted from the N+1 adjusting OTP device 208. Finally, the last output of the apparatus is the second adjusting data written in the second adjusting OTP device 202.

When it is required to change the adjusting signal or to write in a new adjusting data, the writing device 230 writes the N+1th adjusting data in the N+1th adjusting OTP device 208. The N+1th adjusting OTP device 208 is programmed. The Nth judging device 216 outputs the Nth selecting signal according to the programmed N+1th adjusting OTP device 208. The Nth selecting device 226 outputs the Nth adjusting signal by selecting the OTP signal outputted from the N+1th adjusting OTP device 208 between the N−1th adjusting signal and the OTP signal outputted from the N+1 adjusting OTP device 208.

In addition to the apparatus adapted to use OTP devices for multiple-time programming, the present invention also discloses a method adapted to use OTP devices for multiple-time programming. The method comprises following steps. The method first provides the N+1 adjusting OTP devices 200~208, and the N judging devices 210~216. The method then outputs the first adjusting signal by selecting the OTP signal outputted from the first adjusting OTP device 200 or the OTP signal outputted from the second adjusting OTP device 202 according to the selecting signal outputted from the first judging device 210. The method outputs the second adjusting signal by selecting the first adjusting signal between the first adjusting signal and the OTP signal outputted from the third adjusting OTP device 204 according to the selecting signal outputted from the second judging device 212. Accordingly, the method selects and outputs either an OTP signal outputted from the N+1th adjusting OTP device or the N−1th adjusting signal according to the selecting signal outputted from the Nth judging device.

When none of adjusting data is written in any adjusting OTP device, the judging device 216 outputs a selecting signal according to the initial value of the N+1th adjusting OTP device 208. Due to the selecting signal, the Nth selecting device 226 selects and outputs the N−1th adjusting signal between the OTP signal outputted from the N+1th adjusting OTP device 208 or the N−1th adjusting signal. The first selecting device 220, according to the selecting signal responding to the initial value of the second adjusting OTP device 202, selects and outputs the OTP signal of the first adjusting OTP device 200 between the OTP signals outputted by the first adjusting OTP device 200 or the second adjusting OTP device 202.

When it is the first time to adjust the integrated circuit, the writing device 230 writes a first adjusting data in the first adjusting OTP device 200. The first adjusting OTP device 200 is programmed. Because the judging device 210 outputs the selecting signal according to the initial value of the second adjusting OTP devices 202, the first selecting device 220 outputs a first adjusting signal by selecting the OTP signal outputted from the first adjusting OTP device 200 between the OTP signals outputted from the first adjusting OTP device 200 or the second adjusting OTP device 202. The second selecting device 222 outputs a second adjusting signal by selecting the first adjusting signal between the first adjusting signal and the OTP signal outputted from the third adjusting OTP device 204. Accordingly, the Nth selecting device 226 outputs the Nth adjusting signal by selecting the N−1th adjusting signal between the N−1th adjusting signal and the OTP signal outputted from the N+1 adjusting OTP device 208. Finally, the last output of the apparatus is the first adjusting data written in the first adjusting OTP device 200.

When it is the second time to adjust the integrated circuit, the writing device 230 writes a second adjusting data in the second adjusting OTP device 202. The second adjusting OTP device 202 is programmed. The first judging device 210 outputs a first selecting signal. Due to the first selecting signal, the first selecting device 220 outputs a first adjusting signal by selecting the OTP signal outputted form the second adjusting OTP device 202 between the OTP signals outputted from the first adjusting OTP device 200 and the second adjusting OTP device 202. The second judging device 212 outputs a second selecting signal according to the initial value of the third adjusting OTP device 204. Due to the second selecting signal, the second selecting device 222 outputs a second adjusting signal by selecting the first adjusting signal between the first adjusting signal and the OTP signal outputted from the third adjusting OTP device 204. Accordingly, the Nth judging device 216 outputs the Nth selecting signal according to the initial value of the adjusting OTP device 208. Due to the Nth selecting signal, the Nth selecting device 226 outputs the Nth adjusting signal by selecting the N−1th adjusting signal between the N−1th adjusting signal and the OTP signal outputted from the N+1 adjusting OTP device 208. Finally, the last output of the apparatus is the second adjusting data written in the second adjusting OTP device 202.

When it is required to change the output signal or to write in a new adjusting data, the writing device 230 writes the N+1th adjusting data in the N+1th adjusting OTP device 208. The N+1th adjusting OTP device 208 is programmed. The Nth judging device 216 outputs the Nth selecting signal according to the programmed N+1th adjusting OTP device 208. The Nth selecting device 226 outputs the Nth adjusting signal by selecting the OTP signal outputted from the N+1th adjusting OTP device 208 between the N−1th adjusting signal and the OTP signal outputted from the N+1 adjusting OTP device 208.

Accordingly, when the apparatus of the present invention comprises N+1 adjusting OTP devices, N+1 times of writing adjusting data in the adjusting OTP devices can be executed. The present invention therefore achieves multiple-time programming function by using OTP devices. Although using OTP devices, the present invention performs as does a multiple-time programming (MTP) device. The process for manufacturing OTP devices is simpler than that of MTP devices and compatible with the other semiconductor manufacturing process. There are more foundry companies that can provide such manufacturing process. The manufacturing of OTP devices, therefore, is not limited to some specified companies and the costs of such OTP devices are low.

Although the present invention has been described in terms of exemplary embodiments, it is not limited thereto. Rather, the appended claims should be constructed broadly to include other variants and embodiments of the invention that may be made by those skilled in the field of this art without departing from the scope and range of equivalents of the invention.

What is claimed is:

1. An apparatus adapted to use one-time programming (OTP) devices for multiple-time programming, the apparatus comprising:
   a first adjusting OTP device adapted to output a first OTP signal;
   a second adjusting OTP device adapted to output a second OTP signal;
   a judging device coupled to the second adjusting OTP device, adapted to output a selecting signal; and
   a selecting device coupled to the first adjusting OTP device, the second adjusting OTP device and the judging device, adapted to select and output either the first OTP signal or the second OTP signal according to the selecting signal.

2. The apparatus adapted to use one-time programming (OTP) devices for multiple-time programming of claim 1, further comprising a writing device coupled to the first adjusting OTP device and the second adjusting OTP device, adapted to write a first adjusting data in the first adjusting OTP device and a second adjusting data in the second adjusting OTP device.

3. The apparatus adapted to use one-time programming (OTP) devices for multiple-time programming of claim 2, wherein when the writing device writes the second adjusting data in the second adjusting OTP device, the selecting device selects and outputs the second OTP signal between the first OTP signal and the second OTP signal according to the selecting signal outputted from the judging device.

4. The apparatus adapted to use one-time programming (OTP) devices for multiple-time programming of claim 1, wherein the first and second adjusting OTP devices comprise a plurality of poly fuses.

5. The apparatus adapted to use one-time programming (OTP) devices for multiple-time programming of claim 1, wherein the first and second adjusting OTP devices comprise a plurality of metal wires adapted to be adjusted by laser.

6. The apparatus adapted to use one-time programming (OTP) devices for multiple-time programming of claim 1, wherein the first and second adjusting OTP devices comprise a plurality of devices that are programmable at least once.

7. The apparatus adapted to use one-time programming (OTP) devices for multiple-time programming of claim 1, wherein the first and second OTP devices comprise EPROM, EEPROM, or FLASH.

8. The apparatus adapted to use one-time programming (OTP) devices for multiple-time programming of claim 1, wherein the judging device determines whether the second OTP signal of the second adjusting OTP device has an initial value and outputs the selecting signal.

9. The apparatus adapted to use one-time programming (OTP) devices for multiple-time programming of claim 1, the selecting device comprises an AND gate or an OR gate.

10. An apparatus adapted to use one-time programming (OTP) devices for multiple-time programming, comprising:
N+1 adjusting OTP devices which are named in the sequence from 1,2, . . . to N+1, each of the adjusting OTP devices outputting an OTP signal, wherein N is an integer not less than 1;
N judging devices which are named in the sequence from 1,2, . . . to N, each of the judging devices outputting a selecting signal, wherein N is an integer not less than 1; and
N selecting devices which are named in the sequence from 1,2, . . . to N, each of the selecting devices outputting an adjusting signal, wherein an Nth judging device is coupled to an N+1th adjusting OTP device; an Nth selecting device is coupled to the N+1th adjusting OTP device, an N−1th selecting device and the N+1th judging device, adapted to select and output either the OTP signal outputted from the N+1th adjusting OTP device or the adjusting signal outputted from the N−1th selecting device according to the selecting signal outputted from the Nth judging device; a first judging device is coupled to a second adjusting OTP device; a first selecting device is coupled to a first adjusting OTP device, a second OTP adjusting device and a first judging device, adapted to select and output either the OTP signal outputted from the first adjusting OTP device or the OTP signal outputted from the second adjusting OTP device according to the selecting signal outputted from the first judging device.

11. The apparatus adapted to use one-time programming (OTP) devices for multiple-time programming of claim 10, further comprising a writing device coupled to the adjusting OTP devices, adapted to write a plurality of OTP data in the adjusting OTP devices.

12. The apparatus adapted to use one-time programming (OTP) devices for multiple-time programming of claim 11, wherein when the writing device writes an N+1th adjusting data in the N+1th adjusting OTP device, the Nth selecting device selects and outputs the N+1th OTP signal according to the Nth selecting signal outputted from the Nth judging device.

13. The apparatus adapted to use one-time programming (OTP) devices for multiple-time programming of claim 10, wherein the adjusting OTP devices comprise a plurality of poly fuses.

14. The apparatus adapted to use one-time programming (OTP) devices for multiple-time programming of claim 10, wherein the adjusting OTP devices comprise a plurality of metal wires adapted to be adjusted by laser.

15. The apparatus adapted to use one-time programming (OTP) devices for multiple-time programming of claim 10, wherein the adjusting OTP devices comprise a plurality of devices that are programmable at least once.

16. The apparatus adapted to use one-time programming (OTP) devices for multiple-time programming of claim 10, wherein each of the OTP devices comprises EPROM, EEPROM, or FLASH.

17. The apparatus adapted to use one-time programming (OTP) devices for multiple-time programming of claim 10, wherein the judging device determine whether the OTP signals of the adjusting OTP devices are an initial value and output the selecting signals.

18. The apparatus adapted to use one-time programming (OTP) devices for multiple-time programming of claim 10, the each of the selecting devices comprises an AND gate or an OR gate.

19. A method adapted to use one-time programming (OTP) devices for multiple-time programming, comprising:
providing N+1 adjusting OTP devices which are named in the sequence from 1, 2, . . . to N+1, each of the adjusting OTP devices outputting an OTP signal;
providing N judging devices which are named in the sequence from 1,2, . . . to N, each of the judging devices outputting a selecting signal; and
outputting a first adjusting signal by selecting either an OTP signal outputted from a first adjusting OTP device or an OTP signal outputted from a second adjusting OTP device according to a selecting signal outputted from a first judging device; and
selecting and outputting either an OTP signal outputted from an N+1th adjusting OTP device or an adjusting signal outputted from an N−1th selecting device according to a selecting signal outputted from an Nth judging device.

20. The method adapted to use one-time programming (OTP) devices for multiple-time programming of claim 19, wherein the Nth judging device outputs a selecting signal according to an initial value of the N+1th adjusting OTP device, an Nth selecting device selects and outputs an N−1th adjusting signal between the OTP signal outputted from the N+1 adjusting OTP device and the N−1th adjusting signal outputted according to the selecting signal, the first judging device outputs a selecting signal according to an initial valve of the second adjusting OTP device, a first selecting device selects and outputs an OTP signal outputted from the first adjusting OTP device between OTP signals of the first and second adjusting OTP devices according to the selecting signal, and the method further comprises:
writing a first adjusting data in the first adjusting OTP device; and
writing a N+1th adjusting data in the N+1th adjusting OTP device, the N judging devices determining that the N+1th adjusting OTP device select and output an OTP signal outputted from the N+1th adjusting OTP device between the OTP signal outputted from the N+1th adjusting OTP device and the N−1th adjusting signal.

21. The method adapted to use one-time programming (OTP) devices for multiple-time programming of claim 19, wherein the adjusting OTP devices comprise a plurality of poly fuses.

22. The method adapted to use one-time programming (OTP) devices for multiple-time programming of claim 19, wherein the adjusting OTP devices comprise a plurality of metal wires adapted to be adjusted by laser.

23. The method adapted to use one-time programming (OTP) devices for multiple-time programming of claim 19, wherein the adjusting OTP devices comprise a plurality of devices that are programmable at least once.

24. The method adapted to use one-time programming (OTP) devices for multiple-time programming of claim 19, wherein each of the OTP devices comprises EPROM, EEPROM, or FLASH.

25. The method adapted to use one-time programming (OTP) devices for multiple-time programming of claim 19, wherein the judging device determine whether the OTP signals of the adjusting OTP devices have an initial value and output the selecting signals.

26. The method adapted to use one-time programming (OTP) devices for multiple-time programming of claim 19, wherein the each of the selecting devices comprises an AND gate or an OR gate.

27. A method adapted to use one-time programming (OTP) devices for multiple-time programming, comprising:
providing a first adjusting OTP device adapted to output a first OTP signal;
providing a second adjusting OTP device adapted to output a second OTP signal;
providing a judging device coupled to the second adjusting OTP device, adapted to output a selecting signal; and
selecting and outputting either the first OTP signal or the second OTP signal according to the selecting signal outputted from the judging device.

28. The method adapted to use one-time programming (OTP) devices for multiple-time programming of claim 27, wherein the judging device outputs a selecting signal according to an initial value of the second adjusting OTP device, a selecting device selects and outputs an OTP signal outputted from the first adjusting OTP device between OTP signals of the first and second adjusting OTP devices according to the selecting signal, and the method further comprises:
writing a first adjusting data in the first adjusting OTP device; and
writing a second adjusting data in the second adjusting OTP device, the judging devices determining that the second adjusting OTP device select and output an OTP signal outputted from the second adjusting OTP device between the OTP signals outputted from the first and the second adjusting OTP devices.

29. The method adapted to use one-time programming (OTP) devices for multiple-time programming of claim 27, wherein the adjusting OTP devices comprise a plurality of poly fuses.

30. The method adapted to use one-time programming (OTP) devices for multiple-time programming of claim 27, wherein the adjusting OTP devices comprise a plurality of metal wires adapted to be adjusted by laser.

31. The method adapted to use one-time programming (OTP) devices for multiple-time programming of claim 27, wherein the adjusting OTP devices comprise a plurality of devices that are programmable at least once.

32. The method adapted to use one-time programming (OTP) devices for multiple-time programming of claim 27, wherein each of the OTP devices comprises EPROM, EEPROM, or FLASH.

33. The method adapted to use one-time programming (OTP) devices for multiple-time programming of claim 27. wherein the judging device determine whether the OTP signals of the adjusting OTP devices are the initial value and output the selecting signals.

34. The method adapted to use one-time programming (OTP) devices for multiple-time programming of claim 27, wherein the each of the selecting devices comprises an AND gate or an OR gate.

* * * * *